(12) United States Patent
Heitzer et al.

(10) Patent No.: US 7,683,460 B2
(45) Date of Patent: Mar. 23, 2010

(54) MODULE WITH A SHIELDING AND/OR HEAT DISSIPATING ELEMENT

(75) Inventors: Ludwig Heitzer, Regensburg (DE); Christian Stümpfl, Schwandorf (DE); Michael Bauer, Nittendorf (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/534,374

(22) Filed: Sep. 22, 2006

(65) Prior Publication Data

US 2008/0073756 A1    Mar. 27, 2008

(51) Int. Cl.
*H01L 23/552* (2006.01)
(52) U.S. Cl. .............. 257/659; 257/692; 257/728; 257/E23.104; 257/E23.114
(58) Field of Classification Search .......... 257/660, 257/E23.051, E23.104, E25.005, 659, 692, 257/728, E23.114
See application file for complete search history.

(56) References Cited

U.S. PATENT DOCUMENTS

| 4,663,737 | A | * | 5/1987 | Akiba et al. ............. 365/2 |
|---|---|---|---|---|
| 5,825,042 | A | | 10/1998 | Strobel et al. |
| 6,261,508 | B1 | | 7/2001 | Featherby et al. |
| 6,294,838 | B1 | | 9/2001 | Peng ......................... 257/777 |
| 6,335,225 | B1 | * | 1/2002 | Doan ......................... 438/123 |
| 6,417,576 | B1 | | 7/2002 | Ellenberger et al. ......... 257/787 |
| 6,618,267 | B1 | | 9/2003 | Dalal et al. ................ 361/767 |
| 6,737,750 | B1 | * | 5/2004 | Hoffman et al. ............. 257/777 |
| 6,818,978 | B1 | * | 11/2004 | Fan ............................. 257/686 |
| 6,906,416 | B2 | | 6/2005 | Karnezos .................... 257/723 |
| 6,933,597 | B1 | | 8/2005 | Poddar et al. |
| 2003/0209783 | A1 | | 11/2003 | Casati et al. |
| 2004/0051170 | A1 | | 3/2004 | Kawakami et al. |
| 2004/0183180 | A1 | | 9/2004 | Chung et al. ................ 257/686 |
| 2004/0231872 | A1 | | 11/2004 | Arnold et al. ................ 174/35 |
| 2005/0040501 | A1 | | 2/2005 | Hagen ......................... 257/660 |
| 2006/0118319 | A1 | * | 6/2006 | Wang et al. .................. 174/36 |

FOREIGN PATENT DOCUMENTS

| EP | 1675179 | 6/2006 |
|---|---|---|
| JP | 61110440 | 5/1986 |

OTHER PUBLICATIONS

Patent Abstract of JP61110440 dated May 28, 1986, 1 page.

* cited by examiner

*Primary Examiner*—Minh-Loan T Tran
*Assistant Examiner*—W. Wendy Kuo
(74) *Attorney, Agent, or Firm*—Banner & Witcoff, Ltd.

(57) ABSTRACT

A module (100) comprises a component (10) and a shielding element (11), which is mounted on a main surface (12) of the component (10) and has a welding contact (13).

29 Claims, 6 Drawing Sheets

MODULE WITH A SHIELDING AND/OR HEAT DISSIPATING ELEMENT

TECHNICAL FIELD

The invention relates to a module with a shielding and/or heat dissipating element. The invention also relates to a method for producing a module of this type.

BACKGROUND

Components which are sensitive to electromagnetic interference may be protected from electromagnetic radiation by suitable shielding elements. In this case, either the component to be protected may be shielded or the electromagnetic radiation may be prevented from being emitted into the surroundings by shielding the component or components that generate the electromagnetic radiation.

Many modern components heat up while they are in operation. In order that the functional capability of the component is not impaired by the heat generated, the heat produced during operation is dissipated by means of suitable heat dissipating elements.

SUMMARY

According to an embodiment, a module may comprise a first component, and a shielding element, which is mounted on a first main surface of the first component and has a welding contact.

BRIEF DESCRIPTION OF THE DRAWINGS

The invention is explained in more detail below by way of example with reference to the drawings, in which.

DETAILED DESCRIPTION

According to an embodiment, a module may comprise a first component and a shielding element. The shielding element is mounted on a first main surface of the first component and has a welding contact.

According to a further embodiment, a module may comprise a first component, a second component and a heat dissipating element. The first and second components are stacked one on top of the other. The heat dissipating element is arranged at least partly between the first and second components and has at least one exposed surface.

According to a further embodiment, a module may comprise at least one component, at least one connecting line, which is connected to the at least one component, and a conductive element. The conductive element has at least one passage, through which the at least one connecting line is led.

According to a further embodiment, in a method a first component is provided and connected to a shielding and/or heat dissipating element. Subsequently, the first component is mounted together with the conductive element on a support.

Modules which comprise components and methods for producing the modules are described below. The invention is dependent on the type of component. Components may be any type of elements. In particular, the components may be electrical, electromechanical and/or electrooptical components, for example integrated circuits, sensors, microelectromechanical components (MEMS) or laser diodes. The components may be produced on a semiconductor basis or on some other substrate, for example be built up on a ceramic substrate, glass substrate, polymer or PCB. The components may be packaged or unpackaged.

According to one refinement, the modules comprise shielding elements. A shielding element may serve for example for suppressing or reducing electromagnetic radiation or electromagnetic fields and/or their propagation. The suppression or reduction of electromagnetic interference may concern specific spatial directions or be related to specific frequencies. A shielding element may for example be produced from an electrically conductive material, for example a metal or an alloy or a conductive polymer. It may also be an electrically conductive coating of a body which is not otherwise electrically conductive. The shielding element may for example be arranged in the vicinity of a component which is to be protected from electromagnetic interference. The shielding element may for example envelop the component. Under some circumstances, complete envelopment of the component by the shielding element is not necessary, since shielding along one or more spatial directions is already adequate. The shielding element may also be arranged in the vicinity of a component which generates interfering electromagnetic radiation. As a result, the emission of the interfering radiation into the surroundings can be suppressed or reduced.

According to one refinement, a shielding element has a welding contact. The welding contact may be produced in various ways, for example by means of a friction, laser-beam or ultrasonic welding process. In the case of a friction welding process, the heat required for the welding is generated by mechanical friction, in the case of the laser-beam and ultrasonic welding processes the energy is supplied by means of a laser-beam or ultrasonic vibration generated by a generator. With the aid of the welding contact, it is possible for example for a connecting line, in particular a bonding wire, to be connected to the shielding element.

One or more elements of the module, such as for example one or more components, shielding elements, connecting lines or heat dissipating elements, may be built up on a support. The support may be produced for example on a semiconductor basis or be produced from some other material, for example a ceramic substrate, glass substrate, polymer or PCB.

According to one refinement, the component is contacted by means of at least one connecting line. The connecting line permits an electronic connection between the component and for example a further component or a support. The connecting line may be produced from any electrically conductive material, such as for example a metal or an electrically conductive polymer. The connecting line may be a conductor track. The connecting line may, furthermore, be produced for example by means of a wire bonding technique or a flip-chip technique.

One refinement provides a heat dissipating element. The heat dissipating element may be any element capable of conducting heat and accordingly carrying it away. A material, for example a metal, an alloy, a glass or a crystalline nonmetal, which has a sufficiently high coefficient of thermal conductivity may be used as the material for the heat dissipating element. The heat dissipating element is designed for example for transporting away heat which is generated by one or more components of the module. The heat dissipating element may, however, also carry away heat which is generated by elements outside the module, in order to prevent or reduce the heating of one or more components of the module.

Figure 1:
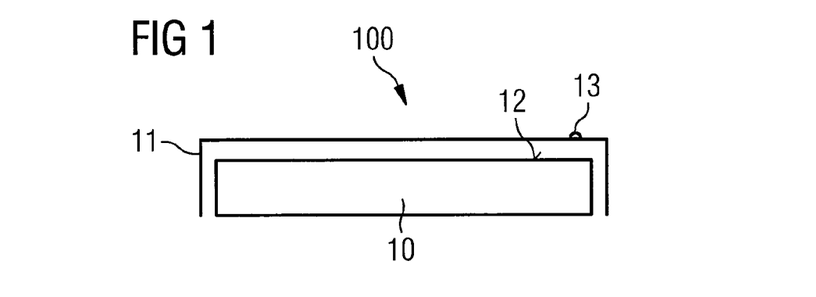
FIG. 1 shows a schematic representation of a module 100 as an exemplary embodiment of the invention.

In FIG. 1, a module 100 is represented in cross section as an exemplary embodiment of the invention. The module 100 comprises a component 10 and a shielding element 11. The shielding element 11 has been mounted on a main surface 12 of the component 10. The shielding element 11 has a welding contact 13.

The shielding element 11 serves the purpose of at least partly shielding electromagnetic radiation. In this case, the electromagnetic radiation may be generated for example by a component 10. In this case, the shielding element 11 prevents the disturbance of further components by the radiation emitted by the component 10. Furthermore, it may also be provided for example that the component 10 is protected by the shielding element 11 from interfering electromagnetic radiation which is generated by a radiation source located inside or outside the module 100.

Metals, such as for example aluminum, copper, iron or gold, or alloys or electrically conductive polymers or graphite come into consideration for example as materials for the shielding element 11. The shielding element 11 does not necessarily have to be produced completely from these materials. For example, the shielding element 11 may be at least partly coated with one or more of these materials.

The welding contact 13 may for example serve as a possibility for electrical contacting, in order to permit a predetermined electric potential, for example ground, to be applied to the shielding element 11. The welding contact 13 is for example a friction welding contact or a laser-beam welding contact or an ultrasonic welding contact.

According to one refinement, the component 10 is a semiconductor chip. The main surface 12 is for example the active main surface of the semiconductor chip.

According to a further refinement, the component 10 and the shielding element 11 are adhesively bonded to each other. Furthermore, a foil may be introduced between the component 10 and the shielding element 11 and subsequently heated, whereby a solid connection is obtained between the component 10 and the shielding element 11. Other die attach methods may also be used for connecting the shielding element 11 to the component 10.

Figure 2:
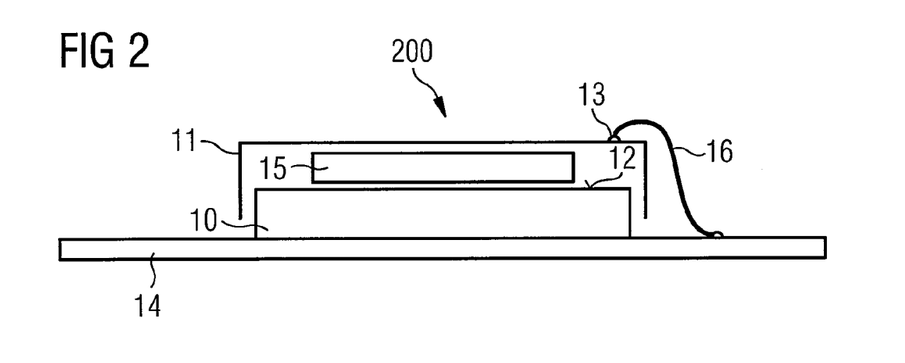
FIG. 2 shows a schematic representation of a module 200 as a further exemplary embodiment of the invention.

In FIG. 2, a module 200 is represented as a further exemplary embodiment of the invention, the difference in the case of this module as compared with the module 100 being that the component 10 is mounted on a support 14 and an electrically insulating spacer 15 is arranged between the main surface 12 of the component 10 and the shielding element 11. Furthermore, the shielding element 13 is electrically connected to the support 14 by means of a bonding wire 16. The bonding wire 16 is attached to the shielding element 11 by means of the welding contact 13.

The support 14 may be produced for example from a semiconductor material, ceramic material, glass, polymer or PCB.

The spacer 15 electrically insulates the shielding element 11 from the component 10. Furthermore, the spacer 15, which leaves the edge region of the main surface 12 of the component 10 exposed, permits access to the edge region of the main surface 12 of the component 10. If the component 10 is for example a semiconductor chip, electrically conductive connections can be established in a simple way with respect to contact elements of the semiconductor chip which are located on the main surface 12.

The bonding wire 16 permits the electric potential of the shielding element 11 to be connected to a predetermined potential, for example ground.

According to one refinement, the shielding element 11 comprises a base plate, which is attached on the spacer 15, and side parts, which extend from the base plate in the direction of the support 14. As represented in FIG. 2, the side parts of the shielding element 11 may be designed in such a way that they do not touch the support 14. This has the advantage that for example conductor tracks on the support 14 can run under the side parts of the shielding element 11. Accordingly, the position of the side parts of the shielding element 11 do not have to be taken into consideration when preparing the layout of the support 14.

As further refinements, further components may be arranged together with the component 10 on the support 14. In this case, the further components may for example be stacked on the component 10 and the shielding element 11 and/or be arranged between the component 10 and the support 14. Furthermore, it is also possible for example for a number of components to be shielded by the shielding element 11. The attachment of the individual components to one another and to the support 14 and the spacer 15 takes place for example by means of adhesive bonding methods or other die-attach methods.

Figure 3:
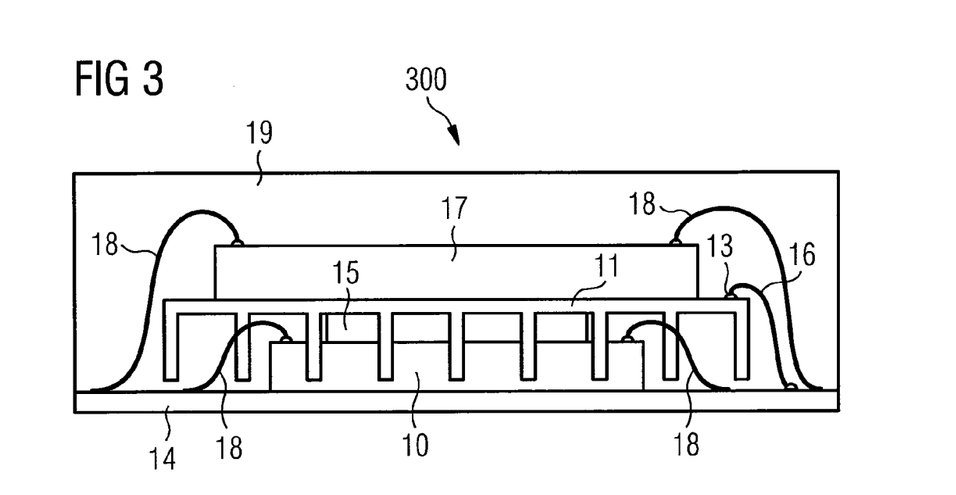
FIG. 3 shows a schematic representation of a module 300 as a further exemplary embodiment of the invention.

In FIG. 3, the module 300 is represented as a further exemplary embodiment of the invention, in the case of which module the side walls of the shielding element 11 are formed like a comb. In addition, a component 17 is stacked on the shielding element 11 and contact elements of the components 10 and 17 are electrically connected to the support 14 by means of connecting lines 18. The connecting lines 18 were produced here by means of a wire bonding technique. Alternatively, the connecting lines 18 may also be produced by means of other techniques, for example at least the component 10 may be connected to the support 14 by means of a flip-chip technique.

According to one refinement, the elements arranged on the support 14 are enveloped in a casting compound 19 by encapsulation. A polymer melt, glob top or turboplastic may be used for example as the casting compound 19.

According to one refinement, the shielding element 11 has a prefabricated structure, i.e. the shielding element 11 is for example not produced from a flexible net or an electrically conductive casting compound. It has already been explained above that the shielding element 11 may for example comprise a base plate and side parts. For example, the shielding element 11 may be a rectangular planar copper plate, the four edges of which are each bent away by approximately 90°, in order also to ensure lateral shielding of the component 10. The prefabricated structure allows the shielding element 11 to be adhesively attached in a simple way, for example by means of an insulating adhesive, to a main surface of the component 10.

As shown in FIG. 3, the side walls may be formed like a comb. Furthermore, the shielding element 11 may take any geometrical form. It is for example conceivable to use just an electrically conductive plate for shielding electromagnetic radiation.

Furthermore, the shielding element 11 may for example be formed as a heat dissipating element. Apart from shielding electromagnetic radiation, in the case of this refinement the shielding element 11 has the task of carrying away heat which is produced for example by the component 10 and/or the component 17. In this case, the shielding element 11 is produced from a material with a sufficiently high thermal conductivity, for example a metal. The heat to be carried away may for example be fed to a heat sink. Alternatively, it is also conceivable to distribute the heat produced during the operation of the module 300 via the shielding element 11 in the module 300. This measure may already be sufficient for the cooling of the components 10 and/or 17.

According to one refinement, the component 10 is designed as a radio-frequency chip and the component 17 is designed as a baseband chip of a radio transmitter and/or receiver. During transmitting mode, baseband signals that are to be transmitted are generated in the baseband chip 17 and transferred via an interface to the radio-frequency chip 10. The radio-frequency chip 10 mixes the baseband signals to a transmission frequency. The resultant radio-frequency signals are emitted via an antenna. During receiving mode, the radio-frequency signals received by the antenna are accepted by the radio-frequency chip 10 and mixed into the baseband. After that, they are transferred to the baseband chip 17 for further processing.

The radio-frequency chip 10 generates interfering electromagnetic radiation, which may have adverse effects on the functioning of the baseband chip 17. The effect of the interfering radiation generated by the radio-frequency chip 10 on the baseband chip 17 is at least reduced by the shielding element 11.

Figure 4:
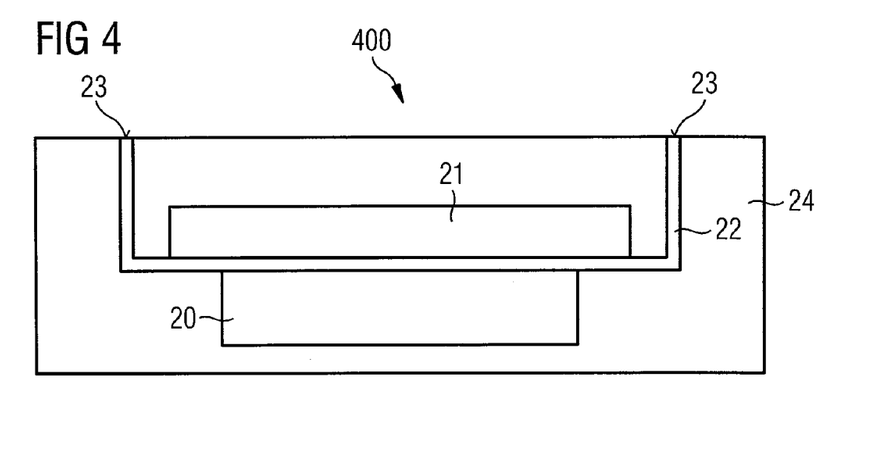
FIG. 4 shows a schematic representation of a module 400 as a further exemplary embodiment of the invention.

In FIG. 4, the module 400 is represented in cross section as a further exemplary embodiment of the invention. The module 400 comprises components 20 and 21, which are stacked one on top of the other. The module 400 also comprises a heat dissipating element 22, which is partly arranged between the two components 20 and 21. The heat dissipating element 22 has two surfaces 23, which are exposed and accordingly accessible from outside the module 400.

The heat dissipating element 22 serves for example for dissipating heat which is generated by the component 20 and/or the component 21 during operation. It may also be provided that heat which is generated by a further component arranged inside or outside the module 400 is to be carried away.

According to one refinement, the components 20 and/or 21 are in each case a semiconductor chip. According to a further refinement, the components 20 and 21 and also the heat dissipating element 22 are integrated in a package. For example, the components 20 and 21 and also the heat dissipating element 22 are enveloped in a casting compound 24 by encapsulation in such a way that only the surfaces 23 are exposed. A polymer melt may be used for example as the casting compound 24.

The heat dissipating element 22 may take various geometrical forms. For example, it may be formed substantially as a planar plate. In this case, at least one of the side faces of the plate may be exposed. For example, it is also conceivable for the heat dissipating element 22 to have a base plate and for one or more heat conductors to lead from this base plate to the surface of the module 400. According to one refinement, the base plate is formed in a substantially rectangular manner and on each of the four corners of the base plate there stands, substantially vertically, a heat conductor, which leads to the surface of the module 400.

For the case where heat is to be carried away from the components 20 and/or 21, one refinement provides that a good thermal coupling exists between the components 20 and/or 21 and also the heat dissipating element 22, in order to ensure effective dissipation of the heat. For example, the heat dissipating element 22 may have one or two at least partly planar surfaces, which is/are connected to likewise planar surfaces of the components 20 and/or 21. A large contact area between the components 20 and/or 21 and also the heat dissipating element 22 improves the thermal coupling.

A good thermal connection of the components 20 and/or 21 to the heat dissipating element 22 can also be achieved by a soldered connection which connects the surfaces of the respective component 20 and/or 21 to the surface of the heat dissipating element 22, for example by diffusion brazing.

According to one refinement, the heat dissipating element 22 is substantially thermally decoupled from the support 25. This means in particular that no heat conductor leads from the heat dissipating element 22 to the support 25.

Metals, such as for example aluminum, copper, iron or gold, or alloys or crystalline nonmetals which have a sufficiently high coefficient of thermal conductivity are suitable in particular as materials for the heat dissipating element 22.

According to a further refinement, apart from its heat dissipating function, the heat dissipating element 22 is used as a shielding element for shielding electromagnetic radiation. In this case, a material, for example a metal, which is also suitable for shielding electromagnetic radiation may be chosen for the heat dissipating element 22. If the heat dissipating element 22 is not produced from an electrically conductive material, it may be coated with an electrically conductive material. In addition, a predetermined electric potential, for example ground, may be applied to the heat dissipating element 22, for example by means of a welding contact (e.g. a bonding wire contact).

Figure 5:
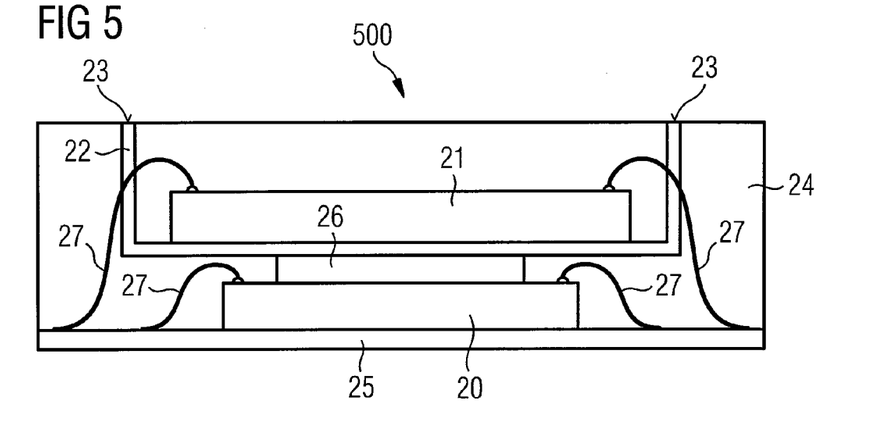
FIG. 5 shows a schematic representation of a module 500 as a further exemplary embodiment of the invention.

In FIG. 5, a module 500 is represented as a further exemplary embodiment of the invention, in which module the component 20 is arranged on the support 25 and a spacer 26 is arranged on top. The heat dissipating element 22 with the component 21 is stacked over the spacer 26.

The support 25 may be produced for example from a semiconductor material, a ceramic material, glass, polymer or PCB. The support 25 may also be a leadframe, for example of copper.

The spacer 26 may consist of an electrically insulating material. For example, the spacer 26 may be a double-sided adhesive film.

For some applications, it is desirable that the material of the spacer 26 is also thermally insulating. If, for example, the component 20 and the support 25 are to be thermally decoupled from a high-power component 21, the thermally insulating material of the spacer 26 contributes to lessening the heat flow from the component 21 to the component 20 and increasing the heat dissipation via the heat dissipating element 22.

According to one refinement, the components 20 and 21 may be semiconductor chips which are electrically connected to the support 25 by means of connecting lines 27. The electrical contacting may take place for example by means of a wire bonding technique, as is represented in FIG. 5. Alternatively, at least the component 20 may be connected to the support 25 by means of a flip-chip technique.

As further refinements, further components may be arranged together with the components 20 and 21 on the support 25. In this case, the further components may for example be stacked on the component 21 and/or be arranged between the heat dissipating element 22 and the support 25. The attachment of the individual components to one another and to the support 25 takes place for example by means of adhesive bonding or soldering methods or some other die attach methods.

Figure 6:
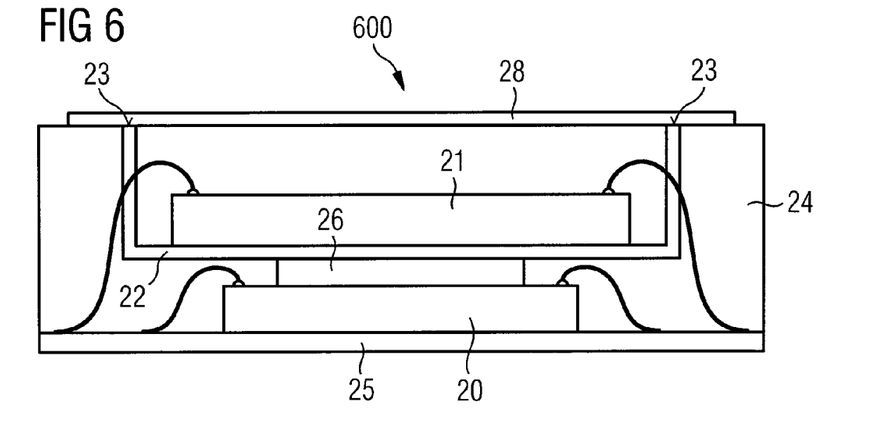
FIG. 6 shows a schematic representation of a module 600 as a further exemplary embodiment of the invention.

In the case of the module 500 shown in FIG. 5, the heat to be carried away is emitted over the exposed surfaces 23 into the surroundings. As an alternative refinement, a module 600 is represented in FIG. 6 as a further exemplary embodiment of the invention, in which module a heat sink 28 is arranged on the package formed by the casting compound 24 and is thermally coupled to the surfaces 23 of the heat dissipating element 22. The heat sink 28 has a large surface area and accordingly can carry away comparatively considerable heat per unit of time to the surroundings.

The same materials as for the heat dissipating element 22 come into consideration as materials for the heat sink 28.

The heat sink 28 may either be attached on the package formed by the casting compound 24 during the production of the module 600 or may be fitted on the package in a later working step.

Figure 7:
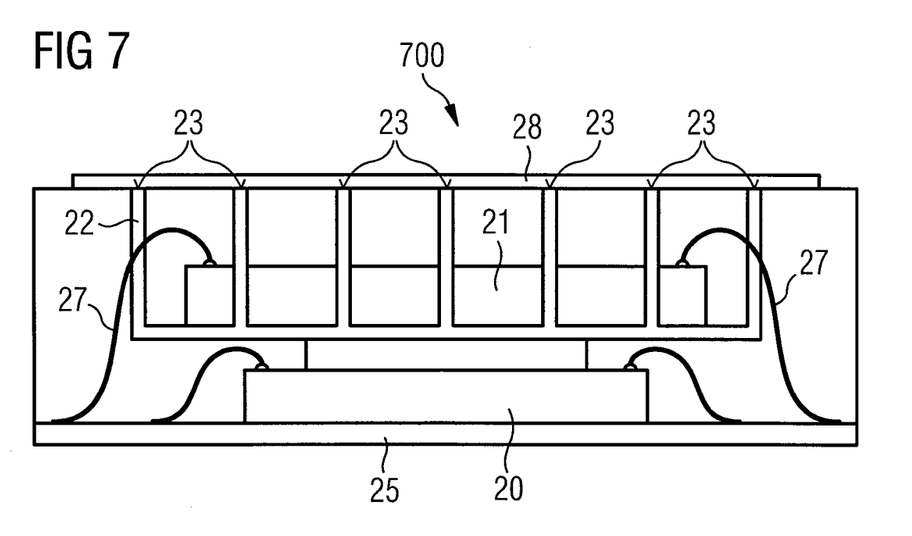
FIG. 7 shows a schematic representation of a module 700 as a further exemplary embodiment of the invention.

In FIG. 7, a module 700 is represented as a further exemplary embodiment of the invention, which module corresponds in large parts to the module 600. As a difference from the module 600, the heat dissipating element 22 of the module 700 has substantially comb-like side parts, which lead from the base plate of the heat dissipating element 22 to the surfaces 23 or the heat sink 28. The large number of heat conductors ensure good dissipation of the heat from the module 700.

Figure 8:
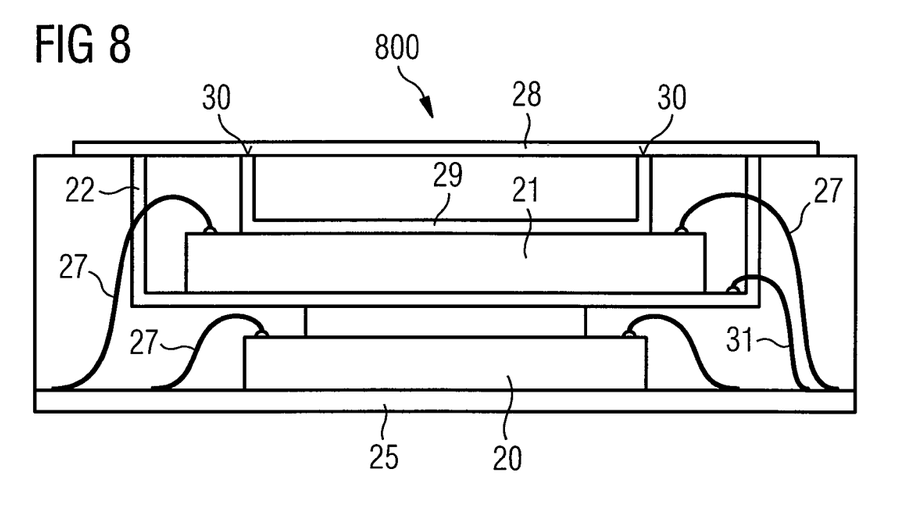
FIG. 8 shows a schematic representation of a module 800 as a further exemplary embodiment of the invention.

In FIG. 8, a module 800 is represented as a further exemplary embodiment of the invention, which module corresponds in large parts to the module 600. As a difference from the module 600, the module 800 comprises a further heat dissipating element 29, which is arranged on the component 21 and has surfaces 30, which are either exposed or are connected to the heat sink 28. Improved cooling of the component 21 is brought about by the additional heat dissipating element 29.

According to one refinement, the component 21 is designed as a radio-frequency chip and the component 20 is designed as a baseband chip of a radio transmitter and/or receiver. During operation, the radio-frequency chip 21 generally heats up. The heat produced is carried away by means of the heat dissipating element 22 and, if appropriate, the heat dissipating element 29.

According to a further refinement, the heat dissipating elements 22 and/or 29 are additionally used as shielding elements for shielding electromagnetic radiation. To allow in this case a predetermined electric potential, in particular ground, to be applied to the heat dissipating element 22 and/or 29, the heat dissipating elements 22 and/or 29 are actively connected to the support 25 and/or the components 20 and/or 21. For example, the heat dissipating element 22 may be electrically connected to the underside of the component 21 by an electrically conductive adhesive or by diffusion bonding. The heat dissipating element 29 may be electrically connected to the active upper side of the component 21. An electrical connection of the heat dissipating element 22 to the support 25 is represented in FIG. 8 by way of example by a bonding wire 31.

Figure 9A:
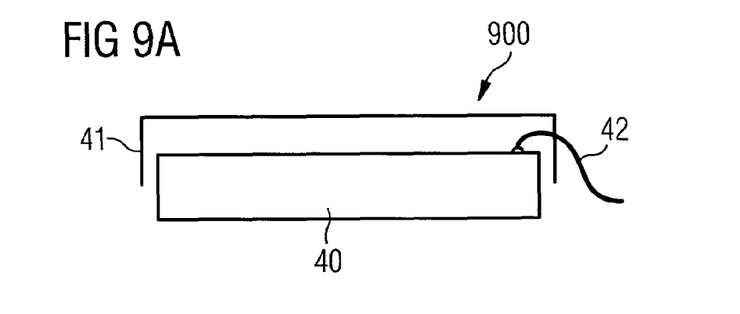
FIGS. 9A and 9B show a schematic representation of a module 900 as a further exemplary embodiment of the invention.
Figure 9B:
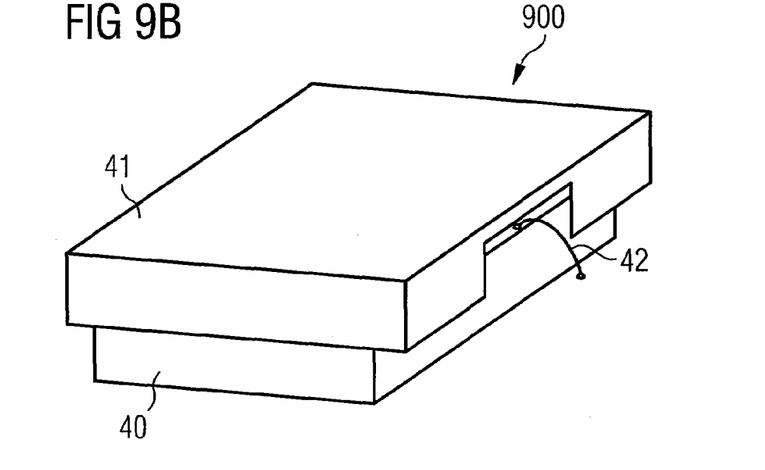

In FIGS. 9A and 9B, a module 900 is represented in cross section and perspectively as a further exemplary embodiment of the invention. The module 900 comprises a component 40, a conductive element 41 and a connecting line 42, which is connected to the component 40. However, the conductive element 41 has a passage, through which the connecting line 42 is led.

The component 40 is for example a semiconductor chip, which is contacted by means of the connecting line 42 designed as a bonding wire. The conductive element 41 may be configured as a shielding element and/or heat dissipating element. In the first case, at least parts of the element 41 are electrically conductive, while in the second case the element 41 must have sufficiently high thermal conductivity.

In FIGS. 9A and 9B, the conductive element 41 is substantially formed as a box. Like the shielding element 11 that is shown in FIG. 1, it may be a prefabricated structure, for example a base plate of copper with four side walls attached to the base plate. One side wall has a clearance as the passage for the connecting line 42. The conductive element 41 is arranged on the component 40 in such a way that the upper side of the component 40 is completely covered by the base plate of the conductive element 41 and the side walls of the component 40 at least partly covered by the side walls of the conductive element 41. As an alternative, it is also conceivable for example for the base plate of the conductive element 41 to cover the underside of the component 40.

Figure 10:
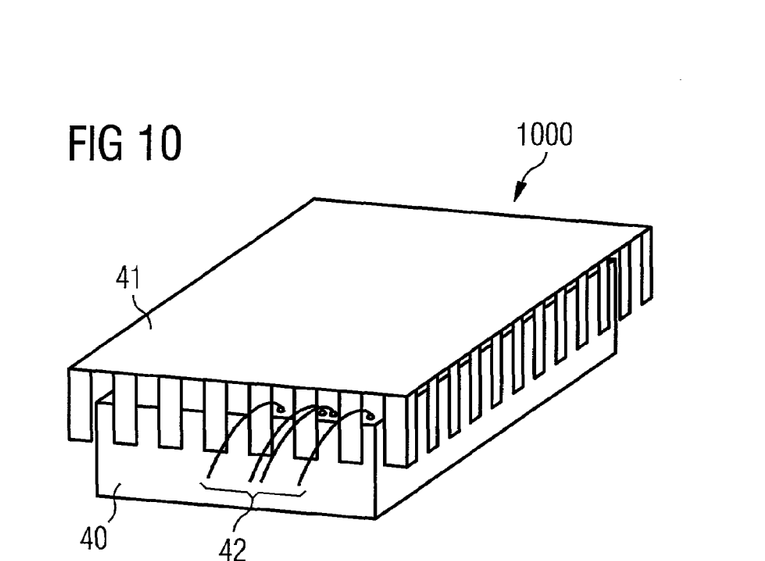
FIG. 10 shows a schematic representation of a module 1000 as a further exemplary embodiment of the invention.
Figure 11:
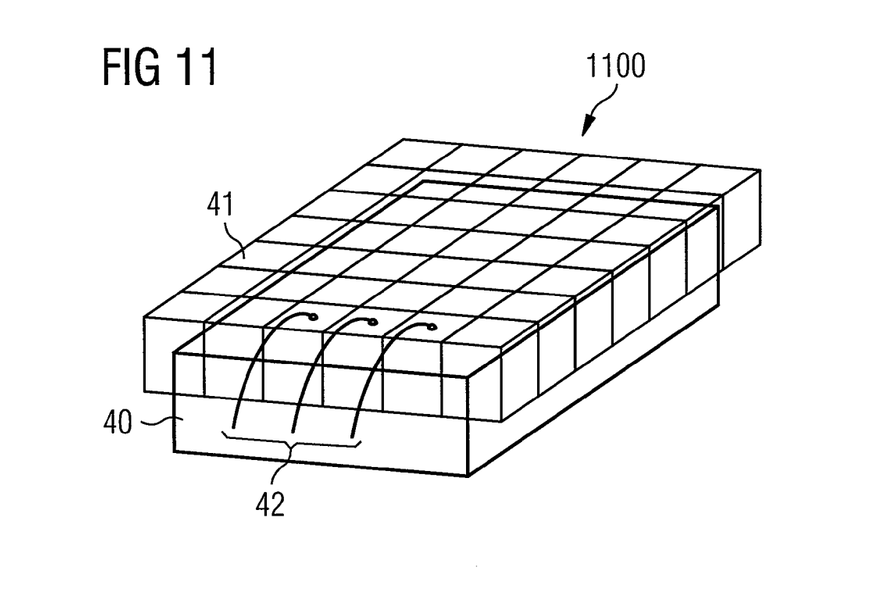
FIG. 11 shows a schematic representation of a module 1100 as a further exemplary embodiment of the invention.

FIGS. 10 and 11 show modules 1000 and 1100 in perspective representations as further exemplary embodiments of the invention. In the case of the modules 1000 and 1100, the conductive element 41 is designed in various ways.

The conductive element 41 shown in FIG. 10 comprises a continuous base plate and comb-like side walls. One or more connecting lines 42 may be respectively led through the passages which are obtained as a result of the comb-like structure of the side walls.

The conductive element 41 shown in FIG. 11 comprises a net-like structure. The connecting lines 42 are led through the meshes of the net. In the production of the module 1100 shown in FIG. 11, the conductive element 41 must first be mounted on the component 40 and then the connecting lines 42 can be attached to the component 40 and led through the meshes of the net of the conductive element 41. In the case of the refinements of the conductive element 41 according to FIGS. 9B and 10, the connecting lines 42 may alternatively also be connected to the component 40 before the conductive element 41 is mounted on the component 40.

Figure 12:
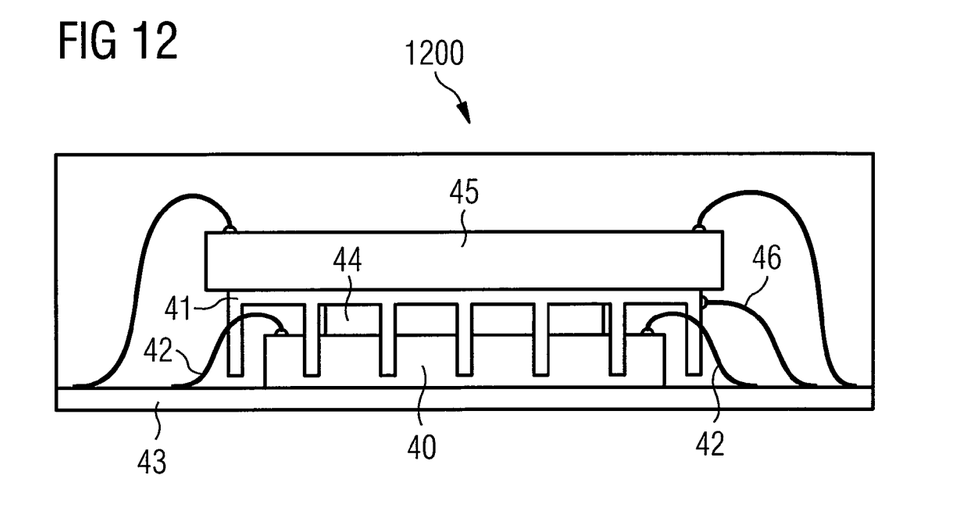
FIG. 12 shows a schematic representation of a module 1200 as a further exemplary embodiment of the invention.

In FIG. 12, a module 1200 is represented as a further exemplary embodiment of the invention, which module corresponds in large parts to the module 300 shown in FIG. 3. The component 40 is mounted on a support 43 and an insulating spacer 44 is arranged between the component 40 and the conductive element 41. The component 45 is mounted on the conductive element 41. The conductive element 41 is connected to the support 43 by means of a bonding wire 46 for a predetermined electric potential to be applied.

In the case of the module 1200, the side walls of the conductive element 41 are designed in a comb-like manner. The connecting lines 42, which electrically connect the component 40 to the support 43, are led through passages which are obtained as a result of the comb-like structure of the side walls of the conductive element 41. This refinement on the one hand permits a space-saving and low-cost type of construction, since the extent of the conductive element 41 can be reduced in comparison with the shielding element 11 that is shown in FIG. 3. On the other hand, on the basis of the refinement that is shown in FIG. 12, the conductive element 41 can be led around the component 40 with a smaller lateral spacing, whereby better shielding of the component 40 can be achieved. Furthermore, it is also possible to use the conductive element 41 additionally for carrying away or distributing heat.

Further exemplary embodiments of the invention, in which connecting lines are led through passages of conductive elements, are given by the modules 500 to 800 that are represented in FIGS. 5 to 8. Here, too, the heat dissipating elements 22 respectively have passages through which connecting lines 27 are led. In the case of the modules 500 to 800, the passages are provided by the intermediate spaces that are obtained between the heat conductors of the heat dissipating element 22 leading to the surfaces 23.

Figure 13:
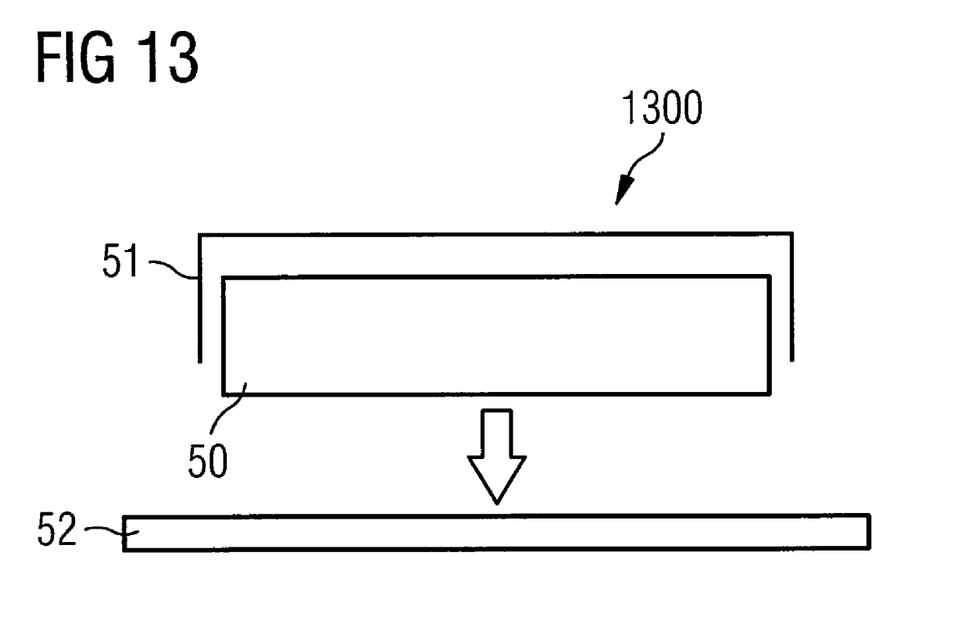
FIG. 13 shows a schematic representation of a method for producing a module 1300 as a further exemplary embodiment of the invention.

In FIG. 13, a method for producing a module 1300 as a further exemplary embodiment of the invention is schematically represented. In the method, first a component 50 is connected to a shielding and/or heat dissipating element 51. In a further method step, the component 50 is mounted together with the shielding and/or heat dissipating element 51 on a support 52.

One advantage of this method is that, for the production of the module 1300, the component 50 and the shielding and/or heat dissipating element 51 can be connected to one another in advance and that this prefabricated module is mounted on the support 52 in a later method step. It is not required first to mount the component 50 on the support 52 and subsequently build the shielding element 51 around the component 50 starting from the surface of the support 52.

In a corresponding way, it is also possible for example to produce the module 300 that is represented in FIG. 3. Here, too, the component 10, the spacer 15 and the shielding element 11 may be joined together in advance.

In a later method step, this prefabricated module is mounted on the support 14.

A similar situation may apply for example to the module 500 that is represented in FIG. 5. The component 21 and the heat dissipating element 22 may be connected to one another in advance and mounted on the spacer 26 in a later method step.

The refinements described above in conjunction with modules 200, 300, 500, 600, 700, 800 and 1200 may likewise comprise the module 1300 in a corresponding way.

The invention claimed is:

1. A module comprising
a substrate;
a first semiconductor component disposed on the substrate such that a first side of the first semiconductor component faces away from the substrate and a second side of the first semiconductor component faces toward the substrate;
an electrically conductive shielding element, which is mounted on the first side of the first semiconductor component, and on a third side of the first semiconductor component, but which is not disposed between the second side of the first semiconductor component and the substrate, wherein the electrically conductive shielding element has a welding contact and a passage, and wherein the electrically conductive shielding element does not touch the substrate; and
a conductive line electrically connected to the first semiconductor component and passing through the passage.

2. The module according to claim 1, wherein the shielding element is mounted on a surface of the first semiconductor component by means of an adhesive bond.

3. The module according to claim 1, wherein the shielding element comprises a prefabricated structure.

4. The module according to claim 1, wherein the first semiconductor component is a first semiconductor chip and an active main surface of the first semiconductor chip is on the first side of the semiconductor chip.

5. The module according to claim 1, wherein the shielding element is produced at least partly from a metal.

6. The module according to claim 1, wherein the module comprises a second semiconductor component, which is mounted on the shielding element.

7. The module according to claim 1, wherein the shielding element is electrically connected to the substrate by means of at least one connecting line.

8. The module according to claim 7, wherein the connecting line is attached to the shielding element by means of the welding contact.

9. The module according to claim 1, wherein the welding contact is a friction welding contact or a laser-beam welding contact or an ultrasonic welding contact.

10. The module according to claim 1, wherein the shielding element is a heat dissipating element.

11. The module according to claim 1, wherein the first semiconductor component is a radio-frequency chip of a radio transmitter or a radio receiver.

12. A module comprising:
a substrate;
a first semiconductor component disposed on the substrate such that a first side of the first semiconductor component faces away from the substrate and a second side of the first semiconductor component faces toward the substrate;
a second semiconductor component disposed on the first side of the first semiconductor component;
an electrically conductive heat dissipating element, which is arranged at least partly between the first and second semiconductor components and has at least one exposed surface, the heat dissipating element not disposed between the first semiconductor component and the substrate, the heat dissipating element having a passage, and wherein the electrically conductive heat dissipating element does not touch the substrate; and
a conducting line electrically connected to the first semiconductor component and passing through the passage.

13. The module according to claim 12, wherein the first semiconductor component and the second semiconductor component are at least partly enveloped in a casting material.

14. The module according to claim 12, wherein the module has a heat sink, which is thermally coupled to the heat dissipating element.

15. The module according to claim 12, wherein the heat dissipating element is a shielding element.

16. The module according to claim 12, wherein the heat dissipating element is electrically conductively connected to at least one of the first semiconductor component and the second semiconductor component.

17. The module according to claim 12, wherein at least one of the first semiconductor component and the second semiconductor component is a radio-frequency chip of a radio transmitter or a radio receiver.

18. A module comprising:
a substrate,
a semiconductor component disposed on the substrate such that a first side of the semiconductor component faces away from the substrate and a second side of the semiconductor component faces toward the substrate,
a connecting line, which is electrically connected to the semiconductor component, and
an electrically conductive element, which has at least one passage, through which the at least one connecting line is led, wherein the electrically conductive element is disposed on the first side of the semiconductor component but not between the semiconductor component and the substrate, and wherein the electrically conductive element does not touch the substrate.

19. The module according to claim 18, wherein the connecting line also is connected to the substrate.

20. The module according to claim 18, wherein the connecting line is produced by means of a wire bonding technique.

21. The module according to claim 18, wherein the conductive element is formed, at least in the region in which the at least one passage is formed, substantially like a comb.

22. The module according to claim 18, wherein the electrically conductive element is formed as at least one of a shielding element and a heat dissipating element.

23. The module according to claim 18, wherein the semiconductor component is a radio-frequency chip of a radio transmitter or a radio receiver.

24. A module, comprising:
a support;
a first semiconductor component mounted on the support;
an electrically conductive shielding element mounted on a surface of the first semiconductor component and having a welding contact and a passage, wherein the electrically conductive shielding element does not touch the support; and
a conductive connecting line passing through the passage and electrically connected to the electrically conductive shielding element at one end and to the support at the other end.

25. The module of claim 1, wherein the passage is formed in the portion of the module that covers the at least one side surface of the first semiconductor component.

26. The module of claim 1, wherein the electrically conductive shielding element comprises an integrally formed comb structure that includes the passage.

27. The module of claim 12, wherein the electrically conductive heat dissipating element is wrapped partially around the first semiconductor component.

28. The module of claim 18, wherein the electrically conductive element is partially wrapped around the semiconductor component.

29. The module of claim 24, wherein the electrically conductive shielding element is partially wrapped around the first semiconductor component.

* * * * *